United States Patent [19]

Noguier et al.

[11] Patent Number: 4,755,862
[45] Date of Patent: Jul. 5, 1988

[54] INTEGRATED TRIAC STRUCTURE WITH DIAC CONTROL

[75] Inventors: Jean P. Noguier, Tours; Jean P. Montaut, St. Cyr sur Loire, both of France

[73] Assignee: SGS-Thomson Microelectronics S.A., Paris, France

[21] Appl. No.: 806,494

[22] Filed: Dec. 9, 1985

[30] Foreign Application Priority Data

Dec. 11, 1984 [FR] France .................. 84 18925

[51] Int. Cl.$^4$ .................. H01L 29/747; H01L 27/12; H01L 29/06
[52] U.S. Cl. .................. 357/39; 357/20; 357/49; 357/50; 357/55; 357/88
[58] Field of Search .................. 357/39, 50, 49, 20, 357/55, 88

[56] References Cited

U.S. PATENT DOCUMENTS

| | | | |
|---|---|---|---|
| 3,508,127 | 4/1970 | Bergman et al. | 357/39 |
| 3,524,114 | 8/1970 | Hutson | 357/39 |
| 3,964,091 | 6/1976 | Berndes et al. | 357/39 |
| 3,970,843 | 7/1976 | Dumas | 357/39 |
| 4,054,893 | 10/1977 | Hutson | 357/39 |

FOREIGN PATENT DOCUMENTS

| | | | |
|---|---|---|---|
| 2253285 | 6/1975 | France | |
| 2279224 | 2/1976 | France | |
| 54-41582 | 11/1979 | Japan | 357/39 C |
| 8300582 | 2/1983 | PCT Int'l Appl. | |

OTHER PUBLICATIONS

Tefft, "Optimization of Triac Garter Trigger Current ($T_{GT}$) and Commutating dv/dt", Power Conversion International, vol 7, No. 1, Jan. 1981, pp. 17 to 24.

Primary Examiner—James J. Carroll
Assistant Examiner—Ngan Ngo
Attorney, Agent, or Firm—Oblon, Fisher, Spivak, McClelland & Maier

[57] ABSTRACT

An integrated triac structure with diac control is provided on a common substrate. The diac is connected to the gate of the triac by a common metallization on the integrated substrate. The diac has a lateral structure with two metallizations on the same face of the substrate. It is separated from the triac by a passivated furrow 16 deeper than the gate region of the triac.

3 Claims, 5 Drawing Sheets

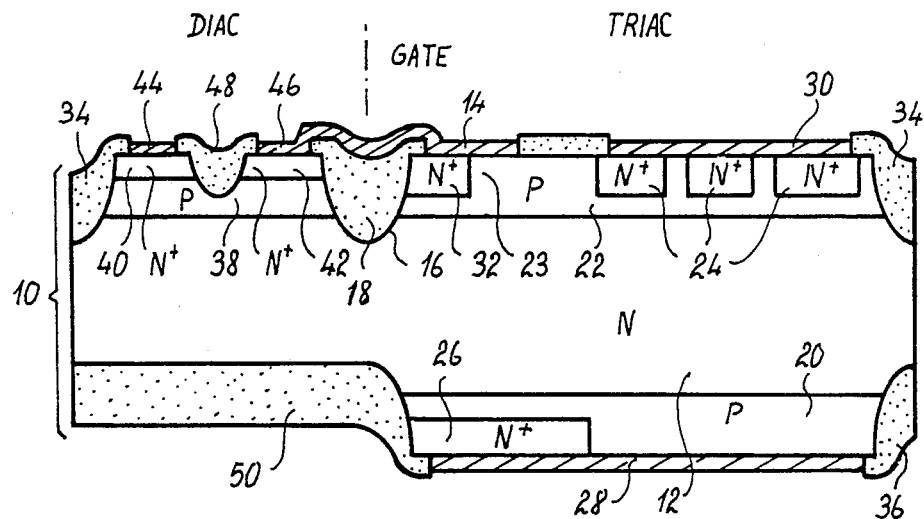
FIG_1
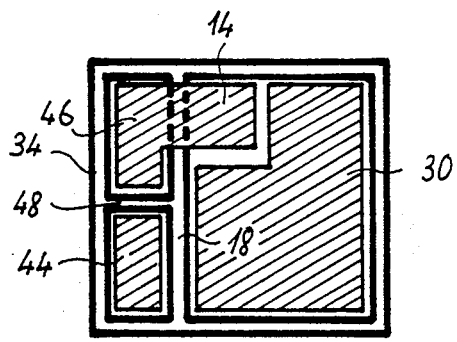
FIG_2-a
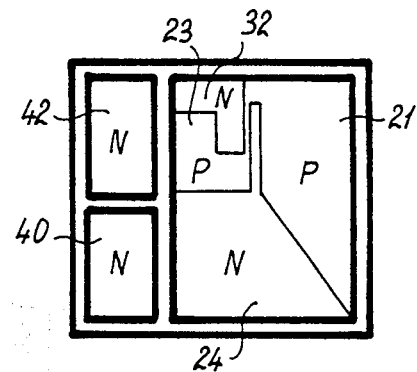
FIG_2-b
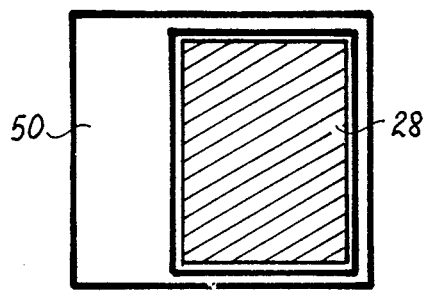
FIG_3-a
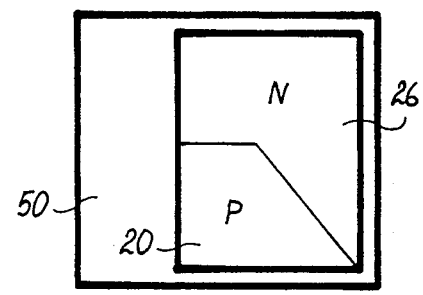
FIG_3-b

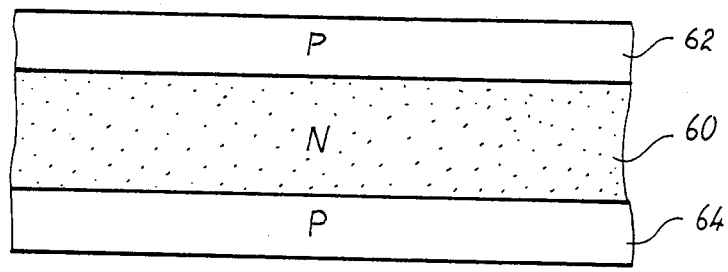
FIG_4
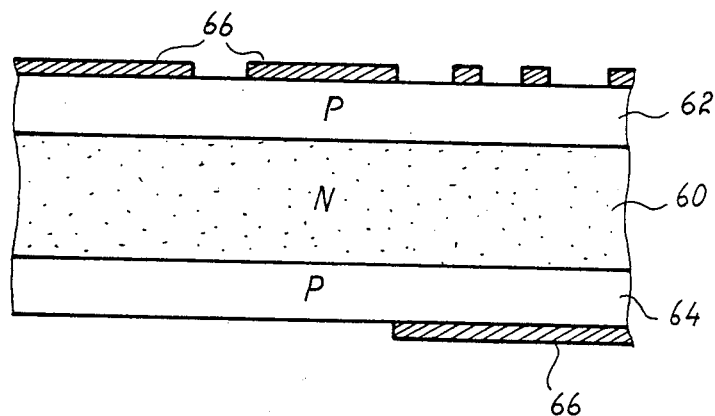
FIG_5
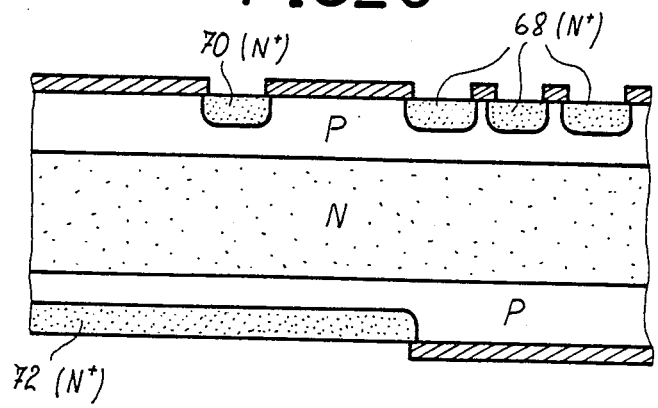
FIG_6

FIG_7
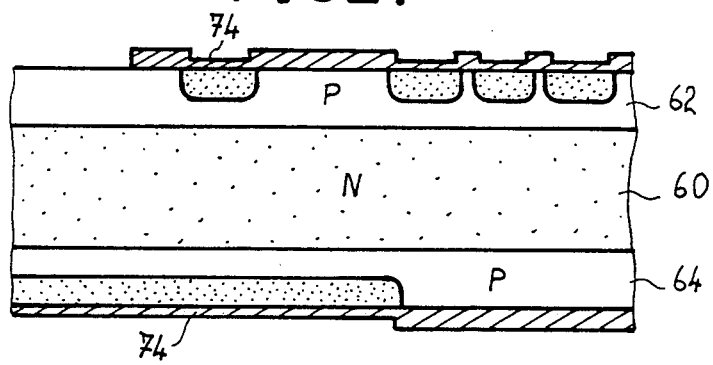
FIG_8
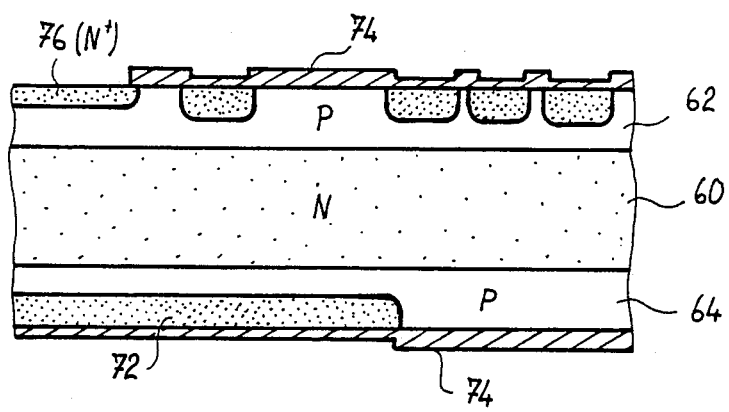
FIG_9
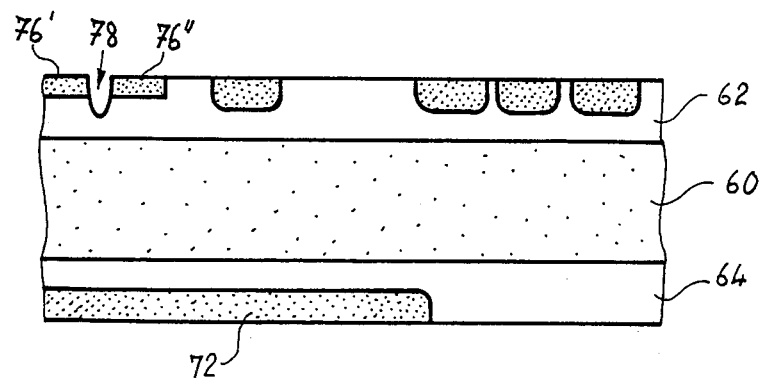

FIG_10
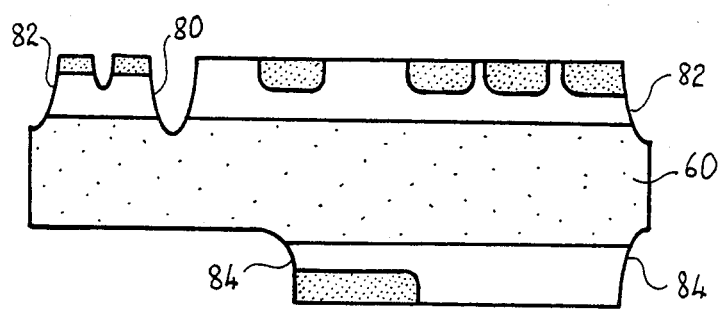
FIG_11
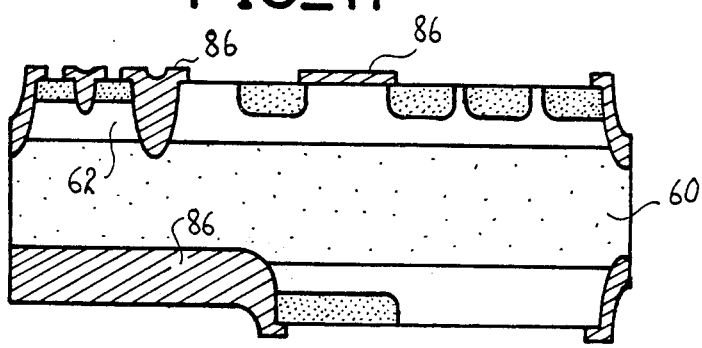
FIG_12
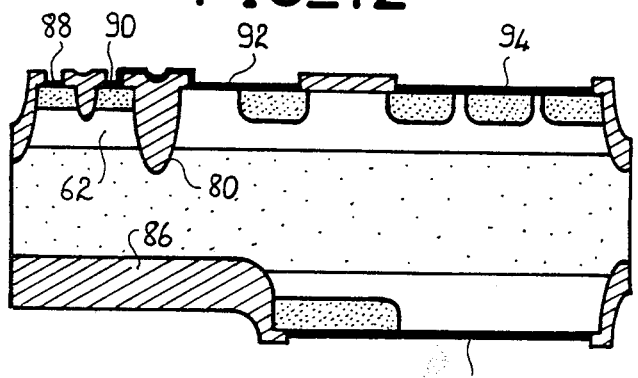

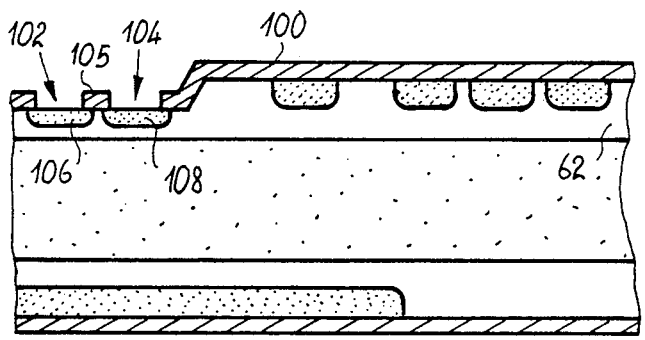
FIG_13
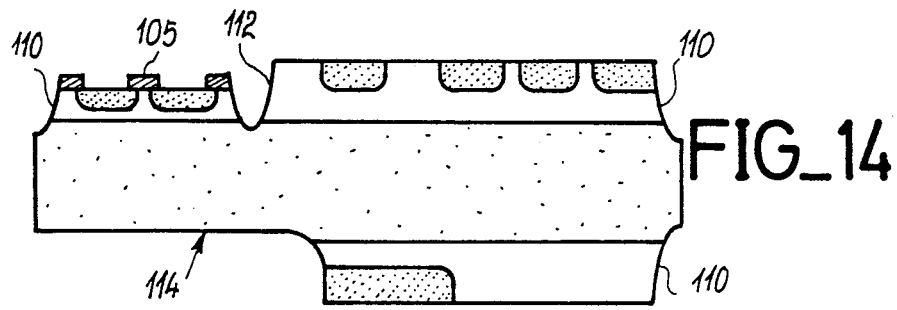
FIG_14
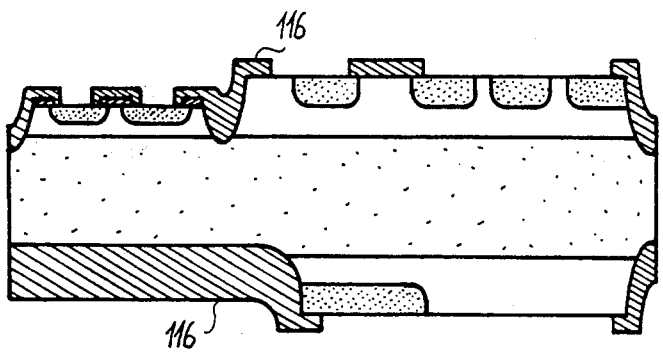
FIG_15
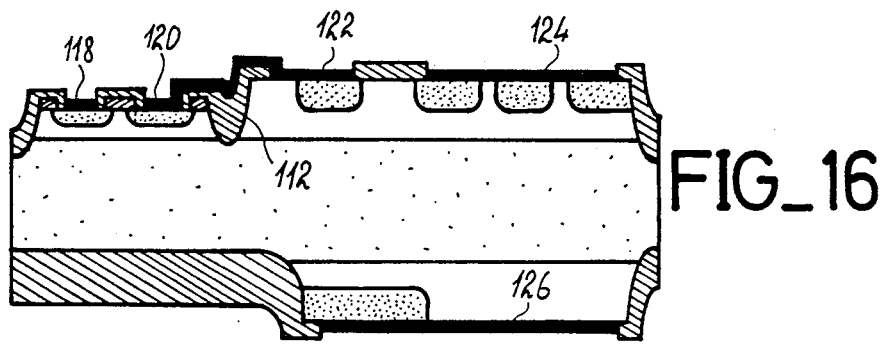
FIG_16

INTEGRATED TRIAC STRUCTURE WITH DIAC CONTROL

BACKGROUND OF THE INVENTION

The invention relates to power switching semiconductor components and more particularly to triacs.

In many applications, it is desirable to control triacs by means of a diac placed upstream of the gate of the triac. A diac is a component with two terminals a little similar to an assembly of two diodes connected head to tail in series, or else to a transistor whose base is disconnected and not accessible, and it has a voltage-current characteristic with a very sharp threshold (acute angle bend in the characteristic) between a disabled region for voltages less in absolute value than a threshold voltage Vd, and a conduction region. The threshold is very sharp because the voltage-current characteristic has a negative dynamic resistance portion immediately beyond the threshold.

For example, a triac is often controlled by means of a diac for forming power variators or light dimmers.

In another application devised by the applicant, a diac is connected between the gate and the anode of a triac (triac with cathode gate), to obtain a component with two terminals only (anode and cathode of the triac) able to be connected as protective element against over voltages between two terminals of a circuit to be protected.

Faced with this requirement, efforts have been made to form the diac and the triac on the same semiconductor substrate. But the integration of these two elements raises problems. In fact, a triac is formed by a structure with four superimposed NPNP or PNPN layers, whereas a diac is formed by a structure with three superimposed PNP or NPN layers. Integration would therefore consist in using for the diac three layers from the four provided for the triac.

Unfortunately, this has proved very difficult for that implies that the main layer forming the semiconductor substrate then forms an active layer both for the diac and for the triac. It would then be necessary to isolate two different parts of the main layer, one for the diac, the other for the triac, which is not possible.

Other electrical or technological requirements make the integration of a triac and a diac very difficult; it is more particularly difficult to provide dopes and layer thicknesses which are compatible for the three layer structure of the diac and the four layer structure of the triac.

SUMMARY OF THE INVENTION

The present invention provides then an unexpected solution which consists in forming the diac not as a structure with three superimposed layers as has always been done for diacs, but in the form of a lateral structure in which two metallized surface regions of the same type of conductivity are formed on the same face of the substrate and are separated from each other while remaining adjacent the same region of opposite type situated below the first two. The face of the substrate which is used is preferably that which comprises a gate metallization for the triac.

In a preferred embodiment, the switching component incorporating on the same semiconductor substrate a triac and a diac connected to the gate of the triac is characterized in that the substrate comprises in a first zone of its surface a triac of conventional construction incorporating alternate regions of opposite conductivity types, one of the regions forming a gate region for the triac, and, in a second zone completely separated from the first one by an isolated furrow cutting the gate region over the whole of its depth, a diac of lateral structure a connecting metallization of which is connected directly electrically to a gate metallization of the triac situated on the same face of the substrate.

Preferably, in the diac zone, the other face of the substrate is hollowed out and isolated so that the substrate does not comprise in this zone more than three superimposed layers of alternate conductivity.

BRIEF DESCRIPTION OF THE DRAWINGS

Other features and advantages of the invention will be clear from reading the detailed description which follows and which is made with reference to the accompanying drawings in which:

FIG. 1 shows in cross section the structure of the component of the invention,

FIGS. 2a and 2b show on a reduced scale top views of the component,

FIGS. 3a and 3b show bottom views,

FIGS. 4 to 12 show the steps of a process for manufacturing the component, and

FIGS. 13 to 16 show different steps of a variant of the process for manufacturing the component.

DESCRIPTION OF THE PREFERRED EMBODIMENTS

The component of the invention is shown in its preferred form in FIG. 1.

It is formed on a single semiconductor substrate 10, cut out for example to a rectangular shape as can be seen in the different top views shown.

In the example chosen, the starting substrate is of type N. A central N layer 12 forms therefore the essential part of the thickness of the substrate.

The semiconductor wafer forming the component is divided into two zones, respectively a zone for the diac on the left of the Figure and a zone for the triac on the right of the Figure. The triac zone occupies a much larger surface for it must let the main current pass through the component, the role of the diac being solely to ensure the transmission of a current for triggering the triac.

The triac is formed in a quite conventional way and, if the substrate were fictitiously cut so as to separate therefrom the diac zone, a triac would be found having, with respect to a conventional triac, only a single difference: the fact that the gate metallization 14 of the triac extends above a furrow 16 formed in the silicon and filled with a passivation layer 18; in a conventional triac, the gate metallization would stop at the edge of the passivated furrow which generally surrounds the wafer forming the triac.

Without entering into the details of the conventional construction of this triac, it may be mentioned here that it comprises two head to tail thyristors in parallel one of which is provided with a metallized gate (metallization 14). A P region 20 forms the anode of one of the thyristors and the gate region (without metallization) of the other. A P region 22, divided into a portion 21 and a portion 23, forms the anode of the other thyristor (portion 21) and the metallized gate region (portion 23); in FIG. 1, only the portion 23 is truly visible because of the sectional plane used for this Figure; the difference between regions 21 and 23 is visible in FIG. 2b. The P regions 20 and 22 are situated on each side of the N region 12; an N region 24 interrupted locally by short circuit holes forms the cathode of the first thyristor, and an N region 26 forms the anode of the second. A first main metallization 28 covers the regions 20 and 26 on the rear face of the wafer. A second main metallization 30 covers regions 12 and 24 on the front face of the thyristor, i.e. on the face which also comprises the gate metallization 14. Finally, it should be mentioned that the gate metallization covers not only the portion 23 of the P layer 22 but also an N layer portion 32, for striking the triac when the potential on the gate metallization is negative with respect to the potential on the second main metallization 30 (striking said to be in the second and third quadrants).

Finally, the references 34 and 36 designate passivated furrows which surround the whole of the wafer (diac +triac) on the upper face and the lower face thereof.

The diac, situated on the left hand part of FIG. 1, is formed by means of three layers of alternate conductivities. In the example chosen, it is an NPN alternation and the central P type region is formed by a region 38 diffused exactly in the same way and at the same time as region 22 forming the gate of the triac.

But, as opposed to known diacs, it is not formed by the superimposition of three alternate layers. On the contrary, it has a lateral structure; an N+ region 40 is diffused over a part of the depth of region 38 and an N+ region 42 is diffused in another part.

The two regions 40 and 42 are separated from each other and each is metallized. The metallization 44 covering region 40 serves as a connection terminal for controlling the whole of a component. The metallization 46 covering region 42 is connected directly to the gate metallization 14 of the triac, over the passivated furrow 16 formed in the silicon over a depth greater than the depth of regions 22 and 38 (this furrow isolates the diac from the triac).

In the example shown in FIG. 1, the N regions 40 and 42 are separated by an isolated furrow 48, of a depth less than that of region 38. The diac functions in the following way: when the voltage across its terminals (metallizations 44 and 46) exceeds a threshold of a few tens of volts, variable depending on the doping pattern of region 38 and on the depth of diffusion of regions 40 and 42, the open based transistor formed by regions 40, 38, 42 becomes suddenly conducting and causes a current to pass to the gate metallization 40, triggering the conduction of the triac. Triggering occurs following avalanching of the junction between regions 38 and 40 or 38 and 42 where this junction meets the passivated furrow 48.

Preferably, as can be seen in FIG. 1, the diac zone does not comprise any superimposition of more than three layers of alternate conductivity (here, layers 40, 38, 12 NPN).

In fact, a fourth layer such as region 20 could, if it were situated below the diac, contribute to the formation of an undesirable parasite thyristor.

This is why, in FIG. 1, the hollowed and passivated substrate has been shown by a glass layer 50 under the whole of the diac zone on the rear face side of the substrate. The depth of the furrow is greater than the depth of the P region 20.

Thus, doping the region 20 may be carried out without masking over the whole rear face of the substrate and then the silicon will be removed by selective chemical etching below the diac.

FIG. 2 shows on a reduced scale at (a) a top view of the component. The periphery of the passivated furrows has been shown in this Figure with a thick continuous line and the metallizations with hatching surrounded by a thinner line; at (b), the forms have been shown of the N and P diffused zones flush with the upper surface of the substrate between the passivated furrows, the metallizations being assumed removed for showing the N and P regions. In the Figures the diac is shown on the left and the triac on the right. The top views of the triac are identical to those of a conventional triac except for the fact that the gate metallization 14 is connected directly, over the passivated furrow 18, to one of the metallizations (46) of the lateral structure diac.

FIG. 3 shows on the same reduced scale the bottom view of the component; at (a) can be seen the single rear face metallization., at (b) can be seen the conventional form of the N and P regions flush with the rear face. In the left hand part of the Figure, only the passivated furrow 50 is visible under the whole of the diac zone.

The short circuit holes have not been shown in these Figures.

FIGS. 4 to 12 show the different steps of a manufacturing process in accordance with the invention.

A semiconductor substrate 60 of a first type of conductivity (here: N) is provided. A non localized diffusion is carried out over both faces of an opposite type of impurity (P) so as to form two layers 62 and 64 whose diffusion pattern varies preferably by decreasing from the surface towards the inside of the substrate (FIG. 4). It is this variable pattern which then allows the triggering voltage of the components to be adjusted by simply adjusting the diffusion depth of regions 40, 42 of FIG. 1.

The surfaces of the substrate are oxidized and the oxide 66 formed on each of the faces of the substrate (FIG. 5) is opened locally by photoetching.

Through the openings of the oxide an N type impurity is diffused, oxide 66 preventing the diffusion of this impurity where it is present. Thus cathode regions 68 are formed on the upper face of the substrate (corresponding to the regions 24 of FIG. 1), and an N type region 70 for access to the gate region (corresponding to region 32 of FIG. 1) on the upper face also. On the lower face by this diffusion is formed a cathode region 72 corresponding to the region 26 of FIG. 1. The N type diffusions extend only over a part of the depth of the P regions 62 and 64 (FIG. 6).

The substrate surfaces are again oxidized (oxide layers 74), and the oxide is opened locally on the upper face of the substrate in the region of the diac (left hand part of FIG. 7).

An N type impurity is diffused in the substrate, the oxide playing the role of diffusion mask. The depth of the region 76 thus diffused is less than that of the P region 62; it is chosen as a function of the doping pattern of this P region 62 so that breakdown of the junction between regions 76 and 62 occurs for a chosen voltage value (of the order of a few tens of volts for example); since the P type impurity concentration decreases progressively the further down in the P layer 62, the breakdown voltage increases if the depth of region 76 increases (FIG. 8).

Then the oxide remaining on the faces of the substrate is eliminated; by photoetching a furrow 78 is formed in the upper face of the substrate for separating the N+ region 76 into two regions 76' and 76" corresponding respectively to the regions 40 and 42 of FIG. 1.

This furrow extends more deeply than region 76 but not as deeply as region 62. Regions 76' and 76" therefore remain adjacent to a common portion of layer 62 (FIG. 9).

Still by photoetching, deep furrows are formed in the silicon on both its faces. One furrow 80 separates the region of the diac from that of the triac (it corresponds to furrow 16 in FIG. 1). A peripheral furrow 82 is formed on the upper face over the whole periphery of the wafer forming the component (diac+triac). A furrow 84 is formed on the other face, over the periphery of the wafer. In addition, furrow 84 is also formed under the whole zone corresponding to the diac. All these furrows are formed to the same depth, greater than the depth of the P regions 62 and 64; they therefore penetrate into the central N region forming the main body of substrates 60 (FIG. 10).

Then the two faces of the substrate are covered with a passivation glass 86 which fills the furrows, then this glass is etched for bearing the silicon where metallizations are to be formed (FIG. 11).

The two faces of the substrate are metallized, for example by aluminium spraying then etching, so as to form two diac electrodes 88 and 90, a triac gate electrode 92 and two main triac electrodes 94 and 96, respectively on the upper face and the lower face of the substrate.

It will be noted that metal is left above furrow 80 for directly connecting a diac electrode 90 to the gate electrode 92 of the triac (FIG. 12). The portion of region 62 situated in the diac zone is isolated from any metallization.

The assembly of this component in a chip carrier may be carried out in the same way as for a triac; the only difference is that the external connection terminal provided for controlling the triac will be connected to the metallization 88 of the diac and not to the gate metallization of the triac.

FIGS. 13 to 16 show the steps of a variant of the process for obtaining a structure slightly different from that of FIG. 1.

If we start again from FIG. 7, i.e. after reoxydization and opening of the oxide 74 of the upper face in the region of the diac, the silicon not covered with oxide is etched so as to hollow it to a depth such that the diac once finished has a well determined threshold voltage.

The silicon is again oxidized after formation of the furrow and the oxide layer 100 thus formed is opened in two regions 102 and 104 corresponding to the two electrodes of the diac.

Then an N type impurity is diffused so as to form regions 106 and 108 which extend over a part only of the depth of the P region 62 (which depth is reduced in the region of the diac). The regions 106 and 108 are separated from each other by a P region portion covered with silicon oxide 105. This oxide 105 protects the portions of the N/P junction flush with the surface of the substrate (FIG. 13). The threshold voltage of the diac is linked to the breakdown of the junction between regions 62 and regions 106 and 108. The breakdown depends on the doping of region 62 (less doped than regions 106 and 108) in the curvature zone of the junction. This is why the threshold voltage is adjusted by hollowing out the silicon in the region of the diac (operation carried out in FIG. 13) to a depth such that the surface doping of region 62 corresponds to the desired threshold voltage.

Then the oxide covering the zone corresponding to the triac is eliminated, while keeping the oxide on the upper face of the substrate in the zone corresponding to the diac; then, the same furrows are formed as mentioned with reference to FIG. 10 (peripheral furrows 110, separation furrow between diac and triac 112, furrow under the whole of the diac 114, FIG. 14).

The substrate is covered with passivation glass 116 over both its faces. The glass also fills the furrows. The glass is etched where it is desired to form metallizations, in the same way as for FIG. 11 (FIG. 15); aluminium is deposited and etched (FIG. 16) for forming two diac metallizations (118 and 120), a gate metallization 122 of the triac, a main triac electrode metallization (124), all on the upper face of the substrate, the metallizations 120 and 122 being connected directly above the passivated furrow 112. A main electrode metallization 126 of the triac is further provided on the lower face of the substrate. The portion of region 62 situated in the zone of the diac is isolated from any metallization.

The component of the invention is particularly well adapted to the construction of a protective element with two terminals, for protecting a circuit against over voltages: in this case, during encapsulation, the metallization for access to the diac (that which is not connected to the gate of the triac) is connected, for example by means of a conducting strip or an aluminimum wire to the connection pin connected to the rear face of the substrate. The only two external terminals of this protective device are therefore connected to the metallizations 28 and 30 of FIG. 1.

What is claimed is:

1. An integrated semiconductor component including a triac and a diac, comprising:
   a substrate having a first face and a second face;
   a first region of first conductivity type formed on said first face;
   a first metallization covering said first region;
   a second region of first conductivity type formed on said first face, separate from said first region;
   a second metallization covering said second region and separate from said first metallization;
   a third region of a second conductivity type adjacent said first and second regions and separate from said first and second metallizations;
   said diac being formed from said first, second and third regions and said first and second metallizations;
   said triac being formed on said substrate;
   one of said first and second metallizations being connected to a gate metallization of said triac on said first face and the other of said first and second metallizations being a control terminal for said component;
   said second face having a portion thereof opposite said disc which is partially removed and passivated.

2. The component according to claim 1, wherein said third region is formed by the same semiconductor layer as a gate region of said triac.

3. The component according to claim 1, further comprising a passivated furrow between said diac and said triac, said furrow being deeper than said third region.

* * * * *